(12) United States Patent
Haberern et al.

(10) Patent No.: US 7,642,626 B2
(45) Date of Patent: Jan. 5, 2010

(54) SEMICONDUCTOR DEVICES INCLUDING MESA STRUCTURES AND MULTIPLE PASSIVATION LAYERS

(75) Inventors: Kevin Ward Haberern, Cary, NC (US); Raymond Rosado, Apex, NC (US); Michael John Bergman, Chapel Hill, NC (US); David Todd Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/959,725

(22) Filed: Dec. 19, 2007

(65) Prior Publication Data

US 2008/0135982 A1 Jun. 12, 2008

Related U.S. Application Data (62) Division of application No. 10/741,240, filed on Dec. 19, 2003, now Pat. No. 7,329,569.

(60) Provisional application No. 60/435,213, filed on Dec. 20, 2002, provisional application No. 60/434,914, filed on Dec. 20, 2002, provisional application No. 60/434,999, filed on Dec. 20, 2002, provisional application No. 60/435,211, filed on Dec. 20, 2002.

(51) Int. Cl.
*H01L 29/06* (2006.01)
*H01L 33/00* (2006.01)
*H01L 29/74* (2006.01)
*H01L 31/111* (2006.01)

(52) U.S. Cl. .................. 257/626; 257/95; 257/170; 257/623

(58) Field of Classification Search ........... 257/600, 257/618, 623, 95, 170, 39, 41, 171, 452, 257/466, 571, 586, 624–626
See application file for complete search history.

(56) References Cited

U.S. PATENT DOCUMENTS

| 4,032,944 A | 6/1977 | van Dongen et al. |
| 4,053,914 A | 10/1977 | Goodwin |
| 4,142,160 A | 2/1979 | Tsukada et al. |

(Continued)

FOREIGN PATENT DOCUMENTS

EP 0 450 255 10/1991

(Continued)

OTHER PUBLICATIONS

U.S. Appl. No. 08/920,409.

(Continued)

*Primary Examiner*—Chuoung A. Luu
(74) *Attorney, Agent, or Firm*—Myers Bigel Sibley & Sajovec, P.A.

(57) ABSTRACT

A semiconductor device including a semiconductor structure defining a mesa having a mesa surface and mesa sidewalls, and first and second passivation layers. The first passivation layer may be on at least portions of the mesa sidewalls, at least a portion of the mesa surface may be free of the first passivation layer, and the first passivation layer may include a first material. The second passivation layer may be on the first passivation layer, at least a portion of the mesa surface may be free of the second passivation layer, and the second passivation layer may include a second material different than the first material.

39 Claims, 5 Drawing Sheets

U.S. PATENT DOCUMENTS

| | | | |
|---|---|---|---|
| 4,531,142 A | | 7/1985 | Weyrich et al. |
| 4,966,862 A | | 10/1990 | Edmond |
| 5,187,108 A | * | 2/1993 | Shinozawa .................. 438/361 |
| 5,208,183 A | * | 5/1993 | Chen et al. ..................... 438/32 |
| 5,243,204 A | | 9/1993 | Suzuki et al. |
| 5,387,804 A | | 2/1995 | Suzuki et al. |
| 5,416,342 A | | 5/1995 | Edmond et al. |
| 5,418,190 A | | 5/1995 | Cholewa et al. |
| 5,429,954 A | | 7/1995 | Gerner |
| 5,499,260 A | | 3/1996 | Takahashi et al. |
| 5,559,053 A | | 9/1996 | Choquette et al. |
| 5,574,743 A | | 11/1996 | Van der Poel et al. |
| 5,631,190 A | | 5/1997 | Negley |
| 5,650,339 A | * | 7/1997 | Saito et al. .................. 438/164 |
| 5,661,074 A | | 8/1997 | Tischler |
| 5,838,706 A | | 11/1998 | Edmond et al. |
| 5,874,747 A | | 2/1999 | Redwing et al. |
| 5,912,477 A | | 6/1999 | Negley |
| 5,916,460 A | | 6/1999 | Imoto et al. |
| 5,923,053 A | | 7/1999 | Jakowetz et al. |
| 5,923,946 A | | 7/1999 | Negley |
| 5,972,781 A | | 10/1999 | Wegleiter et al. |
| 6,048,748 A | | 4/2000 | Khare et al. |
| 6,120,600 A | | 9/2000 | Edmond et al. |
| 6,134,368 A | | 10/2000 | Sakata |
| 6,187,606 B1 | | 2/2001 | Edmond et al. |
| 6,201,262 B1 | | 3/2001 | Edmond et al. |
| 6,204,161 B1 | * | 3/2001 | Chung et al. ................ 438/612 |
| 6,232,623 B1 | | 5/2001 | Morita |
| 6,255,198 B1 | | 7/2001 | Linthicum et al. |
| 6,349,104 B1 | | 2/2002 | Kato et al. |
| 6,365,968 B1 | | 4/2002 | Qian et al. |
| 6,370,176 B1 | | 4/2002 | Okumura |
| 6,373,077 B1 | | 4/2002 | Edmond et al. |
| 6,376,866 B1 | | 4/2002 | Shakuda |
| 6,387,804 B1 | | 5/2002 | Foster |
| 6,413,839 B1 | | 7/2002 | Brown et al. |
| 6,420,252 B1 | * | 7/2002 | Schwed et al. .............. 438/597 |
| 6,432,788 B1 | | 8/2002 | Maruska et al. |
| 6,456,640 B1 | | 9/2002 | Okumura |
| 6,459,100 B1 | | 10/2002 | Doverspike et al. |
| 6,475,889 B1 | | 11/2002 | Ring |
| 6,577,662 B1 | | 6/2003 | Asano et al. |
| 6,580,054 B1 | | 6/2003 | Liu et al. |
| 6,614,824 B2 | | 9/2003 | Tsuda et al. |
| 6,642,546 B2 | | 11/2003 | Kuramoto et al. |
| 6,656,759 B1 | | 12/2003 | Nakanishi et al. |
| 6,677,173 B2 | | 1/2004 | Ota |
| 6,711,191 B1 | | 3/2004 | Kozaki et al. |
| 6,744,800 B1 | | 6/2004 | Kneissl et al. |
| 6,746,948 B2 | | 6/2004 | Ueda et al. |
| 6,756,611 B2 | | 6/2004 | Kiyoku et al. |
| 6,764,870 B2 | | 7/2004 | Okumura |
| 6,784,010 B2 | | 8/2004 | Yamaguchi et al. |
| 6,825,501 B2 | | 11/2004 | Edmond et al. |
| 6,925,101 B2 | | 8/2005 | Matsumura |
| 6,946,682 B2 | | 9/2005 | Slater, Jr. et al. |
| 7,033,854 B2 | | 4/2006 | Morita |
| 7,042,011 B2 | | 5/2006 | Takatani |
| 7,103,082 B2 | | 9/2006 | Sugimoto et al. |
| 7,470,555 B2 | | 12/2008 | Matsumura |
| 2002/0022290 A1 | | 2/2002 | Kong et al. |
| 2002/0034204 A1 | | 3/2002 | Iwamoto et al. |
| 2002/0048835 A1 | | 4/2002 | Kwak |
| 2002/0072250 A1 | | 6/2002 | Jeong et al. |
| 2002/1007225 | * | 6/2002 | Jeong et al. ................ 438/778 |
| 2002/0093020 A1 | | 7/2002 | Edmond et al. |
| 2002/0110945 A1 | | 8/2002 | Kuramata et al. |
| 2002/0123164 A1 | | 9/2002 | Slater et al. |
| 2002/0159494 A1 | * | 10/2002 | Tojo et al. ..................... 372/46 |
| 2003/0006418 A1 | | 1/2003 | Emerson et al. |
| 2003/0006425 A1 | | 1/2003 | Bol et al. |
| 2003/0015721 A1 | | 1/2003 | Slater et al. |
| 2003/0020061 A1 | | 1/2003 | Emerson et al. |
| 2003/0025121 A1 | | 2/2003 | Edmond et al. |
| 2003/0042507 A1 | | 3/2003 | Slater, Jr. et al. |
| 2003/0045015 A1 | | 3/2003 | Slater et al. |
| 2003/0128729 A1 | | 7/2003 | Matsumura |
| 2003/0138981 A1 | | 7/2003 | Yamaguchi et al. |
| 2003/0206567 A1 | | 11/2003 | Takatani |
| 2003/0209722 A1 | | 11/2003 | Hatakoshi et al. |
| 2004/0051118 A1 | | 3/2004 | Bruhns et al. |
| 2004/0147054 A1 | | 7/2004 | Haberern et al. |
| 2004/0245535 A1 | | 12/2004 | D'Evelyn et al. |
| 2005/0167835 A1 | | 8/2005 | Tomiya et al. |
| 2005/0170542 A1 | | 8/2005 | Matsumura |
| 2005/0196888 A1 | | 9/2005 | Morita |
| 2006/0018353 A1 | | 1/2006 | Hata et al. |
| 2007/0228395 A1 | | 10/2007 | Kamiyama et al. |
| 2008/0135982 A1 | | 6/2008 | Haberern et al. |

FOREIGN PATENT DOCUMENTS

| | | |
|---|---|---|
| EP | 0 450 255 A1 | 10/1991 |
| EP | 0 653 823 A2 | 5/1995 |
| EP | 1039600 A2 | 9/2000 |
| EP | 1 104 947 A2 | 6/2001 |
| EP | 1 146 616 A2 | 10/2001 |
| FR | 2 613 547 | 10/1988 |
| GB | 406 665 | 2/1934 |
| GB | 1 223 196 | 2/1971 |
| JP | 09270528 | 10/1997 |
| JP | 09270528 | 1/1998 |
| JP | 09270528 A | 1/1998 |
| JP | 2000-223742 A | 8/2000 |
| WO | WO 01/95446 A1 | 9/2000 |
| WO | WO 01/95446 A | 12/2001 |
| WO | WO 01/95446 A1 | 12/2001 |
| WO | WO 02/37578 A1 | 5/2002 |
| WO | WO 03/030271 A2 | 4/2003 |
| WO | WO 03/030271 A3 | 4/2003 |
| WO | WO 03/010817 A2 | 6/2003 |
| WO | WO 03/010817 A3 | 6/2003 |
| WO | WO 2004/047244 A1 | 6/2004 |

OTHER PUBLICATIONS

D.A.B. Miller; "Semiconductor lasers", Semiconductor Optoelectronic Devices pp. 164-178 (Winter 2002).

I. Stateikina; "Optoelectronic Semiconductor Devices—Principals and Characteristics", 76 pages; http://www.ece.concordia.ca/~i_statel/vlsi-opt/.

C.H. Chang, L. Chrostowski & C.J. Chang-Hasnain, "Parasitics and Design Considerations on Oxide-Implant VCSELs", IEEE Photonics Technology Letters, vol. 13, No. 12, pp. 1274-1276 (Dec. 2001).

Christoper LaBounty et al; Monolithic Integration of Solid State Thermionic Coolers with Semiconductor Lasers; Conference Proceedings of IEEE/LEOS 13th Annual Meeting (LEOS 2000), Rio Grande, Puerto Rico (Nov. 2000) http://www.ece.ucsb.edu/uoeg/research/publicatons/papers/labounty00leos.pdf.

Harold Fetterman, David Scott & D.P. Prakash; "Traveling Wave HPT Technology with Integrated Polymide Optical Waveguides" Final Report for 1999-00 for MICRO Project 99-037 Industrial Sponsor: Raytheon Systems Company. http://www.ucop.edu/research/micro/99_00/99_037.pdf.

"Strained Layer Semiconductor Laser Devices" http://www.microfanatic.com/lasers.html; 5 pages.

A Brief History of Up: Introduction Previous: Introduction: http://www.physics.ucc.ie/opto/hegarty/node3.html.

PCT International Search Report for PCT/US 03/40379.

International Search Report for PCT/US 03/40377.

International Search Report for PCT/US 03/40682.

International Search Report for PCT/US 03/40682 mailed Nov. 3, 2004.

Koren et al., "InGaAsP/Inp undercut mesa laser with planar polyimide passivation", *Applied Physics Letter*, 42(5) 403-405.

International Search Report for PCT/US 03/40483 mailed Nov. 30, 2004.

International Search Report for PCT/US 03/22411, mailed Jul. 6, 2004.

International Search Report for PCT/US03/40377, mailed Jan. 20, 2005.

Sze *Physics of Semiconductor Devices*, 2nd Edition chapter 12.4 "Semiconductor Laser Physics" pp. 704-742 (1981).

I. Stateikina; "Optoelectronic Semiconductor Devices—Principals and Characteristics", 76 pages; http://www.ece.concordia.ca/~i_statei/vlsi-opt/, Feb. 17, 2002.

Invitation to Pay Additional Fees for PCT/US03/40377, mailed Aug. 17, 2004.

Invitation to Pay Additional Fees for PCT/US03/40682, mailed Dec. 18, 2003.

Harold Fetterman, David Scott & D.P. Prakash; "Traveling Wave HPT Technology with Integrated Polymide Optical Waveguides" Final Report for 1999-00 for Micro Project 99-037 Industrial Sponsor: Raytheon Systems Company.

Koren et al., "InGaAsP/InP undercut mesa laser with planar polyimide passivation", *Applied Physics Letter*, 42(5) 403-405, Mar. 1, 1983.

Second Chinese Office Action and English Translation (10 pages) corresponding to Chinese Patent Application No. 200380107146.6; Issue Date: Jan. 9, 2009.

* cited by examiner

SEMICONDUCTOR DEVICES INCLUDING MESA STRUCTURES AND MULTIPLE PASSIVATION LAYERS

RELATED APPLICATIONS

The present application claims the benefit of priority as a divisional of U.S. application Ser. No. 10/741,240 filed Dec. 19, 2003 now U.S. Pat. No. 7,329,569, which claims the benefit of: U.S. Provisional Application No. 60/435,213 filed Dec. 20, 2002; U.S. Provisional Application No. 60/434,914 filed Dec. 20, 2002; U.S. Provisional Application No. 60/434,999 filed Dec. 20, 2002; and U.S. Provisional Application No. 60/435,211 filed Dec. 20, 2002. The disclosures of each of the above referenced utility and provisional applications are hereby incorporated herein in their entirety by reference.

The present application is also related to: U.S. application Ser. No. 10/741,705 filed Dec. 19, 2003; U.S. application Ser. No. 10/741,334 filed Dec. 19, 2003; and U.S. application Ser. No. 10/742,426 filed Dec. 19, 2003. The disclosures of each of these U.S. Applications are hereby incorporated herein in their entirety by reference.

FIELD OF THE INVENTION

The present invention relates to the field of electronics, and more particularly to methods of forming semiconductor devices and related structures.

BACKGROUND

A laser is a device that produces a beam of coherent monochromatic light as a result of stimulated emission of photons. Stimulated emission of photons may also produce optical gain, which may cause light beams produced by lasers to have a high optical energy. A number of materials are capable of producing the lasing effect and include certain high-purity crystals (ruby is a common example), semiconductors, certain types of glass, certain gases including carbon dioxide, helium, argon and neon, and certain plasmas.

More recently, lasers have been developed in semiconducting materials, thus taking advantage of the smaller size, lower cost and other related advantages typically associated with semiconductor devices. In the semiconductor arts, devices in which photons play a major role are referred to as "photonic" or "optoelectronic" devices. In turn, photonic devices include light-emitting diodes (LEDs), photodetectors, photovoltaic devices, and semiconductor lasers.

Semiconductor lasers are similar to other lasers in that the emitted radiation has spatial and temporal coherence. As noted above, laser radiation is highly monochromatic (i.e., of narrow band width) and it produces highly directional beams of light. Semiconductor lasers may differ, however, from other lasers in several respects. For example, in semiconductor lasers, the quantum transitions are associated with the band properties of materials; semiconductor lasers may be very compact in size, may have very narrow active regions, and larger divergence of the laser beam; the characteristics of a semiconductor laser may be strongly influenced by the properties of the junction medium; and for P-N junction lasers, the lasing action is produced by passing a forward current through the diode itself. Overall, semiconductor lasers can provide very efficient systems that may be controlled by modulating the current directed across the devices. Additionally, because semiconductor lasers can have very short photon lifetimes, they may be used to produce high-frequency modulation. In turn, the compact size and capability for such high-frequency modulation may make semiconductor lasers an important light source for optical fiber communications.

In broad terms, the structure of a semiconductor laser should provide optical confinement to create a resonant cavity in which light amplification may occur, and electrical confinement to produce high current densities to cause stimulated emission to occur. Additionally, to produce the laser effect (stimulated emission of radiation), the semiconductor may be a direct bandgap material rather than an indirect bandgap material. As known to those familiar with semiconductor characteristics, a direct bandgap material is one in which an electron's transition from the valence band to the conduction band does not require a change in crystal momentum for the electron. Gallium arsenide and gallium nitride are examples of direct bandgap semiconductors. In indirect bandgap semiconductors, the alternative situation exists; i.e., a change of crystal momentum is required for an electron's transition between the valence and conduction bands. Silicon and silicon carbide are examples of such indirect semiconductors.

A useful explanation of the theory, structure and operation of semiconductor lasers, including optical and electronic confinement and mirroring, is given by Sze, Physics of Semiconductor Devices, 2nd Edition (1981) at pages 704-742, and these pages are incorporated entirely herein by reference.

As known to those familiar with photonic devices such as LEDs and lasers, the frequency of electromagnetic radiation (i.e., the photons) that can be produced by a given semiconductor material may be a function of the material's bandgap. Smaller bandgaps produce lower energy, longer wavelength photons, while wider bandgap materials produce higher energy, shorter wavelength photons. For example, one semiconductor commonly used for lasers is aluminum indium gallium phosphide (AlInGaP). Because of this material's bandgap (actually a range of bandgaps depending upon the mole or atomic fraction of each element present), the light that AlInGaP can produce may be limited to the red portion of the visible spectrum, i.e., about 600 to 700 nanometers (nm). In order to produce photons that have wavelengths in the blue or ultraviolet portions of the spectrum, semiconductor materials having relatively large bandgaps may be used. Group III-nitride materials such as gallium nitride (GaN), the ternary alloys indium gallium nitride (InGaN), aluminum gallium nitride (AlGaN) and aluminum indium nitride (AlInN) as well as the quaternary alloy aluminum gallium indium nitride (AlInGaN) are attractive candidate materials for blue and UV lasers because of their relatively high bandgap (3.36 eV at room temperature for GaN). Accordingly, Group III-nitride based laser diodes have been demonstrated that emit light in the 370-420 n range.

A number of commonly assigned patents and co-pending patent applications likewise discuss the design and manufacture of optoelectronic devices. For example, U.S. Pat. Nos. 6,459,100; 6,373,077; 6,201,262; 6,187,606; 5,912,477; and 5,416,342 describe various methods and structures for gallium-nitride based optoelectronic devices. U.S. Pat. No. 5,838,706 describes low-strain nitride laser diode structures. Published U.S. Application Nos. 20020093020 and 20020022290 describe epitaxial structures for nitride-based optoelectronic devices. Various metal contact structures and bonding methods, including flip-chip bonding methods, are described in Published U.S. Application No. 20020123164 as well as Published U.S. Application No. 030045015 entitled "Flip Chip Bonding of Light Emitting Devices and Light Emitting Devices Suitable for Flip-Chip Bonding"; Published U.S. Application No. 20030042507 entitled "Bonding of Light Emitting Diodes Having Shaped Substrates and Collets for Bonding of Light Emitting Diodes Having Shaped Substrates", and Published U.S. Application No. 20030015721 entitled "Light Emitting Diodes Including Modifications for Submount Bonding and Manufacturing Methods Therefor." Dry etching methods are described in U.S. Pat. No. 6,475,889. Passivation methods for nitride optoelectronic devices are described in U.S. application Ser. No. 08/920,409 entitled "Robust Group III Light Emitting Diode for High Reliability in Standard Packaging Applications" and Published U.S. Application No. 20030025121 entitled "Robust Group III Light Emitting Diode for High Reliability in Standard Packaging Applications." Active layer structures suitable for use in nitride laser diodes are described in Published U.S. Application No. 20030006418 entitled "Group III Nitride Based Light Emitting Diode Structures with a Quantum Well and Superlattice, Group III Nitride Based Quantum Well Structures and Group III Nitride Based Superlattice Structures" and Published U.S. Application No. 20030020061 entitled "Ultraviolet Light Emitting Diode." The contents of all of the foregoing patents, patent applications and published patent applications are incorporated entirely herein by reference as if fully set forth herein.

Stress and/or pressure applied to a surface of an electronic device including a semiconductor laser may damage a semiconductor structure providing the laser and/or electrical couplings therewith.

SUMMARY

According to embodiments of the present invention, methods of forming semiconductor devices may include forming a semiconductor structure on a substrate wherein the semiconductor structure defines a mesa having a mesa surface opposite (i.e. remote from) the substrate and mesa sidewalls between the mesa surface and the substrate. A first passivation layer may be formed on at least portions of the mesa sidewalls and on the substrate adjacent the mesa sidewalls wherein at least a portion of the mesa surface is free of the first passivation layer and wherein the first passivation layer comprises a first material. In addition, a second passivation layer may be formed on the first passivation layer wherein at least a portion of the mesa surface is free of the second passivation layer, and wherein the second passivation layer comprises a second material different than the first material.

Moreover, at least a portion of the first passivation layer adjacent the mesa surface may be free of the second passivation layer, and a combined thickness of the first and second passivation layers may be greater than a thickness of the mesa. More particularly, a thickness of the first passivation layer may be greater than a thickness of the mesa. In addition, a contact layer may be formed on a portion of the mesa surface free of the first and second passivation layers, and a metal layer may be formed on the contact layer wherein the metal layer extends on at least a portion of the second passivation layer opposite the substrate. Moreover, the metal layer and the contact layer may comprise different materials.

A portion of the first passivation layer may extend on a portion of a surface of the contact layer opposite the substrate, or in an alternative, a portion of the contact layer may extend on a portion of at least one of the first and/or second passivation layers opposite the substrate. The first material may include aluminum oxide, and the second material may include silicon nitride. In addition, the semiconductor structure may include a P-type layer and an N-type layer wherein at least a portion of the P-type layer and/or N-type layer is included the mesa.

At least a portion of the mesa surface may be free of the first passivation layer before forming the second passivation layer. More particularly, the second passivation layer may be formed on the first passivation layer and on the at least a portion of the mesa surface free of the first passivation layer. In addition, a hole may be formed in a portion of the second passivation layer exposing the at least a portion of the mesa surface free of the first passivation layer and exposing portions of the first passivation layer adjacent the mesa surface.

Moreover, the first passivation layer may be formed across the mesa surface, and the second passivation layer may be formed across the mesa surface so that the first and second passivation layers are both stacked across the mesa surface. A hole may then be formed in the second passivation layer exposing portions of the first passivation layer opposite the mesa surface, and after forming the hole in the second passivation layer, another hole may be formed in the first passivation layer exposing the at least a portion of the mesa surface. Before forming the first passivation layer, a contact layer may be formed on the mesa surface. In an alternative, a contact layer may be formed on at least portions of the mesa surface free of the first and second passivation layers after forming the second passivation layer.

According to additional embodiments of the present invention, methods of forming semiconductor devices may include forming a semiconductor structure on a substrate wherein the semiconductor structure defines a mesa having a mesa surface and mesa sidewalls between the mesa surface and the substrate. A passivation layer may be formed on the mesa sidewalls and on the substrate adjacent the mesa sidewalls, and the passivation layer may have a via hole therein so that at least a portion of the mesa surface is free of the passivation layer. More particularly, the via hole may define a stair-step profile such that a first portion of the via hole has a first width and a second portion of the via hole has a second width different than the first width.

The stair-step profile may include a plateau region between the first and second portions of the via hole having the first and second widths, and the plateau portion may be substantially parallel to the substrate. The first portion of the via hole having the first width may be between the second portion of the via hole having the second width and the mesa surface, and the second width may be greater than the first width. The passivation layer may include a first layer of a first material and second layer of a second material different than the first material, and the first portion of the via hole may be through at least a portion of the first layer and the second portion of the via hole may be through at least a portion of the second layer. More particularly, a thickness of the first passivation layer may be greater than a thickness of the mesa. In addition, the first material may include aluminum oxide, and the second material may include silicon nitride.

A contact layer may also be formed on the at least a portion of the mesa surface free of the passivation layer, and a metal layer may be formed on the contact layer and on at least portions of the passivation layer. The contact layer and the metal layer may comprise different materials, and a portion of the passivation layer may extend on a portion of the contact layer opposite the mesa surface. In an alternative, the contact layer may extend onto at least a portion of the passivation layer opposite the substrate. Moreover, the semiconductor structure may include a P-type layer and an N-type layer wherein at least a portion of the P-type layer and/or the N-type layer is included in the mesa.

According to still additional embodiments of the present invention, a semiconductor device may include a semiconductor structure on a substrate wherein the semiconductor structure defines a mesa having a mesa surface and mesa sidewalls between the mesa surface and the substrate. A first passivation layer may be on at least portions of the mesa sidewalls and on the substrate adjacent the mesa sidewalls wherein at least a portion of the mesa surface is free of the first passivation layer and wherein the first passivation layer comprises a first material. A second passivation layer may be on the first passivation layer wherein at least a portion of the mesa surface is free of the second passivation layer, and wherein the second passivation layer comprises a second material different than the first material.

At least a portion of the first passivation layer adjacent the mesa surface may be free of the second passivation layer, and a combined thickness of the first and second passivation layers may be greater than a thickness of the mesa. Moreover, a thickness of the first passivation layer may be greater than a thickness of the mesa.

The semiconductor device may also include a contact layer on a portion of the mesa surface free of the first and second passivation layers, and a metal layer on the contact layer wherein the metal layer extends on at least a portion of the second passivation layer opposite the substrate. Moreover, the metal layer and the contact layer may comprise different materials. A portion of the first passivation layer may extend on a portion of a surface of the contact layer opposite the substrate, or in an alternative, a portion of the contact layer may extend on a portion of at least one of the first and/or second passivation layers opposite the substrate.

The first material of the first passivation layer may comprise aluminum oxide, and the second material of the second passivation layer may comprise silicon nitride. In addition, the semiconductor structure may include a P-type layer and an N-type layer wherein at least a portion of the P-type layer and/or N-type layer is included the mesa. Moreover, the first and second passivation layers may define a stair-step profile adjacent the at least a portion of the mesa surface free of the first and second passivation layers.

According to yet additional embodiments of the present invention, a semiconductor device may include a semiconductor structure on a substrate wherein the semiconductor structure defines a mesa having a mesa surface and mesa sidewalls between the mesa surface and the substrate. The semiconductor device may also include a passivation layer on the mesa sidewalls and on the substrate adjacent the mesa sidewalls. More particularly, the passivation layer may have a via hole therein so that at least a portion of the mesa surface is free of the passivation layer wherein the via hole defines a stair-step profile such that a first portion of the via hole has a first width and a second portion of the via hole has a second width different than the first width.

The stair-step profile may include a plateau region between the first and second portions of the via hole having the first and second widths, and the plateau portion may be substantially parallel to the substrate. In addition, the first portion of the via hole having the first width may be between the second portion of the via hole having the second width and the mesa surface and the second width may be greater than the first width.

The passivation layer may include a first layer of a first material and second layer of a second material different than the first material with the first portion of the via hole being through at least a portion of the first layer and with the second portion of the via hole being through at least a portion of the second layer. A thickness of the first passivation layer may be greater than a thickness of the mesa, the first material of the first passivation layer may comprise aluminum oxide, and the second material of the second passivation layer may comprise silicon nitride.

The semiconductor device may also include a contact layer on the at least a portion of the mesa surface free of the passivation layer and a metal layer on the contact layer and on at least portions of the passivation layer, and the contact layer and the metal layer may comprise different materials. A portion of the passivation layer may extend on a portion of the contact layer opposite the mesa surface, or in an alternative, the contact layer may extend onto at least a portion of the passivation layer opposite the substrate. In addition, the semiconductor structure may includes a P-type layer and an N-type layer wherein at least a portion of the P-type layer and/or the N-type layer is included in the mesa.

DETAILED DESCRIPTION

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. It will also be understood that when an element is referred to as being "coupled" or "connected" to another element, it can be directly coupled or connected to the other element, or intervening elements may also be present. Like numbers refer to like elements throughout. Furthermore, relative terms such as "vertical" and "horizontal" may be used herein to describe a relationship with respect to a substrate or base layer as illustrated in the figures. It will be understood that these terms are intended to encompass different orientations of the device in addition to the orientation depicted in the figures.

Group III-V materials such as Group III-nitride materials may be made P-type by doping them with P-type impurities such as magnesium. However, P-type nitride semiconductors may have relatively low carrier activation rates and relatively low carrier mobilities. Accordingly, P-type nitride semiconductor materials may have relatively high resistivities. Because laser diodes may require relatively high current levels to provide conditions for lasing, it may be beneficial for an ohmic contact to a P-type nitride material to cover as much surface area as possible.

Formation of laser diodes may include etching a mesa stripe into an epitaxial layer of a semiconductor material.

Because the mesa stripe may be relatively narrow (on the order of approximately 2 microns in width), the mesa stripe may not have a high degree of mechanical stability, and the mesa stripe may be damaged relatively easily during subsequent fabrication steps such as bar coating, die attach, wafer bonding, etc. A mesa stripe may be formed within a trench of the semiconductor material and/or substrate with the trench having a depth greater than or equal to the height of the mesa to provide mechanical stability and/or protection.

Figure 1:
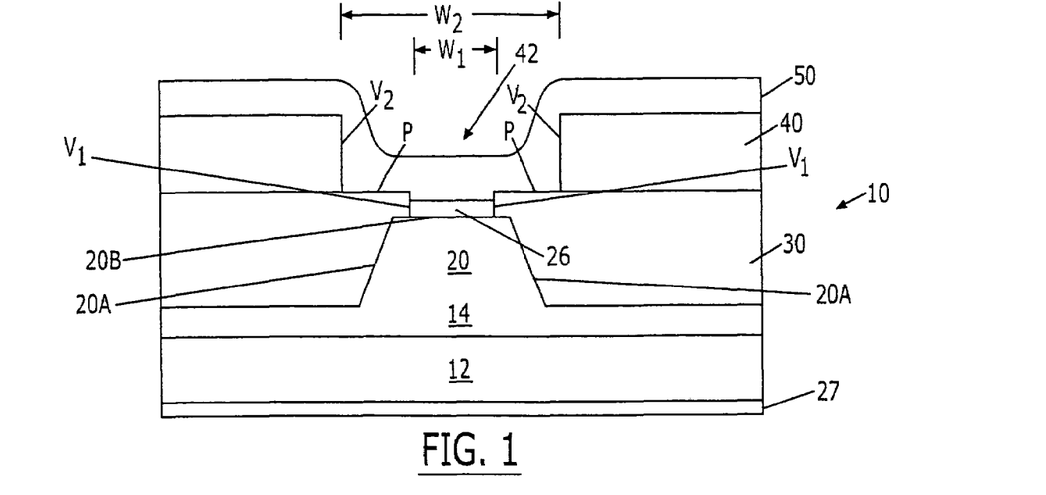
FIG. 1 is a cross-sectional view illustrating semiconductor devices according to embodiments of the present invention.

As shown in FIG. 1, structures according to embodiments of the present invention may provide mechanical protection for a semiconductor mesa stripe. Moreover, the structure of FIG. 1 may be fabricated using steps that may be relatively repeatable and accurate. According to embodiments of the present invention, a semiconductor device may include a substrate 12, an epitaxial semiconductor structure 14 including a mesa 20, a first passivation layer 30, a second passivation layer 40, ohmic contact layers 26 and 27, and a metal overlayer 50. Moreover, the epitaxial semiconductor structure 14 may include a Group III-V compound semiconductor material such as a Group III-nitride compound semiconductor material. The ohmic contact layers 26 and 27 may each comprise a layer of a metal such as nickel, titanium, platinum, and/or palladium. The metal overlayer 50 may comprise a layer of a metal such as nickel, gold, platinum, titanium, tungsten, molybdenum, tantalum, and/or palladium.

In some embodiments, the substrate 12 may include substrate materials such as N-type silicon carbide having a polytype such as 2H, 4H, 6H, 8H, 15R, and/or 3C; sapphire; gallium nitride; and/or aluminum nitride. Moreover, the substrate 12 may be conductive to provide a "vertical" device having a "vertical" current flow through the epitaxial semiconductor structure 14 and the substrate 12. In an alternative, the substrate 12 may be insulating or semi-insulating where both ohmic contacts are provided on a same side of the substrate to provide a "horizontal" device. A conductive substrate could also be used in a "horizontal" device. Moreover, the term substrate may be defined to include a non-patterned portion of the semiconductor material making up the semiconductor structure 14, and/or there may not be a material transition between the substrate 12 and the semiconductor structure 14.

Portions of the epitaxial semiconductor structure 14 may be patterned into a mesa stripe, for example, to provide optical and/or current confinement. As shown, only a portion of the epitaxial semiconductor structure 14 is included in the mesa 20. For example, the epitaxial semiconductor structure 14 may include N-type and P-type layers and portions of one or both of the N-type and P-type layers may be included in the mesa 20. According to particular embodiments, the epitaxial semiconductor structure 14 may include an N-type layer adjacent the substrate 12 and a P-type layer on the N-type layer opposite the substrate 12. The mesa may include portions of the P-type layer and none of the N-type layer; all of the P-type layer and portions (but not all) of the N-type layer; or all of the P-type and N-type layers (such that sidewalls of the mesa 20 extend to the substrate 12).

As discussed in greater detail in U.S. application Ser. No. 10/741,705 filed Dec. 19, 2003, a uniformly thick layer of the epitaxial semiconductor material may be formed, and the mesa 20 may be formed by selectively etching the epitaxial semiconductor material. Moreover, a thickness of the mesa 20 may be determined by a depth of the etch used to form the mesa. According to embodiments of the present invention, the mesa etch depth (and resulting mesa thickness) may be in the range of approximately 0.1 to 5 microns, and according to additional embodiments may be no greater than approximately 2.5 microns. In addition, a width of the mesa surface 20A between mesa sidewalls may be in the range of approximately 1 to 3 microns. As shown in FIG. 1, the ohmic contact layer 26 may be formed on a portion of the mesa surface 20A. Moreover, the surface portion of the mesa may be a P-type semiconductor material.

The first passivation layer 30 may protect and insulate the epitaxial semiconductor structure 14 including the mesa 20. The first passivation layer 30, for example, may include a layer of an insulating material such as silicon dioxide, silicon nitride, aluminum oxide, and/or combinations thereof, and the first passivation layer 30 may be formed using a deposition technique such as plasma enhanced chemical vapor deposition (PECVD), low pressure chemical vapor deposition (LPCVD), chemical vapor deposition (CVD), sputtering, and/or e-beam evaporation. Moreover, the first passivation layer may be fabricated as discussed, for example, in U.S. application Ser. No. 10/741,334 filed Dec. 19, 2003, and/or in U.S. application Ser. No. 10/741,705 filed Dec. 19, 2003. The disclosures of both of these applications are incorporated herein in their entirety by reference.

The second passivation layer 40, for example, may include a layer of an insulating material such as silicon dioxide, silicon nitride, aluminum oxide and/or combinations thereof, and the second passivation layer may be formed using a deposition technique such as plasma enhanced chemical vapor deposition (PECVD), low pressure chemical vapor deposition (LPCVD), chemical vapor deposition (CVD), sputtering, and/or e-beam evaporation. According to particular embodiments of the present invention, the first passivation layer may be formed of a first material, and the second passivation layer may be formed of a second material different than the first material. Accordingly, the first passivation layer may provide an etch selectivity with respect to the second passivation layer for one or more etch chemistries. Stated in other words, the second passivation layer 40 may be more susceptible to certain etch chemistries than the first passivation layer so that a via hole 42 can be formed in the second passivation layer without significantly etching the first passivation layer. According to particular embodiments, the second passivation layer 40 may include a layer of silicon nitride, and the first passivation layer 30 may include a layer of aluminum oxide.

In some embodiments, the second passivation layer 40 may be sufficiently thick so that a surface of the second passivation layer opposite the substrate is substantially higher than the top surface 20B of the mesa 20 relative to the substrate 12. In an alternative, a combined thickness of the first and second passivation layers 30 and 40 may be greater than a thickness of the mesa 20 to a degree sufficient to provide mechanical stability and protection to the mesa 20. According to particular embodiments, the first passivation layer may have a thickness in the range of approximately 0.1 to 2 microns, and the second passivation layer 40 may have a thickness in the range of approximately 0.1 to 5 microns.

The ohmic contact 26 may be formed on the mesa surface 20B before or after forming either of the first and/or second passivation layers 30 and 40. The ohmic contact layer 26 may extend across a substantial entirety of a width of the mesa surface 20B between mesa sidewalls 20A, and/or portions of the first passivation layer 30 may extend on portions of the ohmic contact layer 26 opposite the substrate. In an alternative, portions of the first passivation layer 30 may extend directly on the mesa surface, and/or portions of the ohmic contact layer may extend on portions of the first passivation layer 30 opposite the mesa surface 20B.

A via 42 through the second passivation layer 40 may expose portions of the ohmic contact layer 26 and portions of the first passivation layer 30 adjacent the ohmic contact layer 26. The metal overlayer 50 may extend across the second passivation layer 40, exposed portions of the first passivation layer 30, and/or exposed portions of the ohmic contact layer 26. Accordingly, the metal overlayer 50 may contact the ohmic contact 26 through the via 42. The metal overlayer 50 may include a layer of a metal such as nickel, gold, platinum, titanium, tungsten, molybdenum, tantalum, palladium, and/or combinations thereof.

In addition, the via 42 may have a width that is greater than a width of the mesa surface 20B so that sidewalls of the via 42 are spaced apart from the mesa sidewalls 20A. According to particular embodiments, the via 42 may have a width in the range of approximately 5 to 15 microns. Accordingly, stress and/or pressure applied to a surface of the passivation layer 40 may be directed away from the mesa 20. Moreover, portions of the passivation layer 30 exposed by the via 42 and the mesa 20 may be shielded from external stresses by the surrounding second passivation layer 40.

According to particular embodiments of the present invention, a semiconductor device may include a semiconductor structure, such as epitaxial semiconductor structure 14, defining a mesa 20 having a mesa surface 20B opposite the substrate 12 and mesa sidewalls 20A between the mesa surface 20B and the substrate 12. A first passivation layer 30 may be provided on at least portions of the mesa sidewalls 20A and on the substrate 12 adjacent the mesa sidewalls 20A wherein at least a portion of the mesa surface 20B is free of the first passivation layer 30. A second passivation layer 40 may be provided on the first passivation layer 30 wherein at least a portion of the mesa surface 20B is free of the second passivation layer 40. Moreover, the first and second passivation layers may comprise different materials. In addition, a metal overlayer may be provided on the second passivation layer 40, on portions of the first passivation layer 30 free of the second passivation layer 40, and on portions of the mesa surface 20B free of the first and second passivation layers. An ohmic contact layer 26 may be provided between the metal overlayer 50 and the mesa surface 20B, and the ohmic contact layer 26 and the metal overlayer 50 may comprise different materials.

According to additional embodiments of the present invention, a semiconductor device may include a semiconductor structure 14 on substrate 12, the semiconductor structure 14 defining a mesa surface 20B and mesa sidewalls 20A between the mesa surface 20B and the substrate 12. A passivation layer may be provided on the mesa sidewalls 20A and on the substrate 12 adjacent the mesa sidewalls with the passivation layer having a via therein so that at least a portion of the mesa surface is free of the passivation layer. More particularly, the via in the passivation layer may define a stair-step profile such that a first portion $V_1$ of the via hole has a first width $W_1$ and a second portion of the via hole $V_2$ has a second width $W_2$ different than the first width $W_1$. In addition, the via hole may include a plateau region P between the first and second portions of the via hole, and the plateau region P may be substantially parallel with the substrate 12. More particularly, the second width $W_2$ may be greater than the first width $W_1$. In addition, the second width $W_2$ may be greater than a width of the mesa surface 20B, and the first width $W_1$ may be less than a width of the mesa surface 20B. According to some embodiments, the passivation layer may include a layer of a single material patterned to provide the stair-step profile. In an alternative, the passivation layer may include first and second passivation layers 30 and 40 of different materials so that the second passivation layer 40 can be selectively etched relative to the first passivation layer 30.

Methods of fabricating semiconductor devices according to embodiments of the present invention are illustrated in FIGS. 2A-2D. In particular, an epitaxial semiconductor structure 14 can be formed on a substrate 12, with the epitaxial semiconductor structure 14 including a mesa 20 having mesa sidewalls 20A and a mesa surface 20B. The epitaxial semiconductor structure 14 may be formed by forming a uniformly thick epitaxial semiconductor layer and then selectively removing portions of the epitaxial semiconductor layer to form the mesa 20. Portions of the epitaxial semiconductor layer may be selectively removed using a wet or dry etch such as a reactive ion etch (RIE), an electron cyclotron resonance (ECR) plasma etch, and/or an inductively coupled plasma (ICP) etch. For example, the mesa 20 may be patterned using a dry etch in an argon (Ar) environment using a chlorine ($Cl_2$) etchant. More particularly, the dry etch may include flowing argon (Ar) in the range of approximately 2 to 40 sccm and flowing chlorine ($Cl_2$) in the range of approximately 5 to 50 sccm in an RIE reactor at a pressure at a pressure in the range of approximately 5 to 50 mTorr and at an RF power in the range of approximately 200 to 1000 W. While particular etch conditions have been provided by way of example, other etch conditions may be used.

Figure 2A:
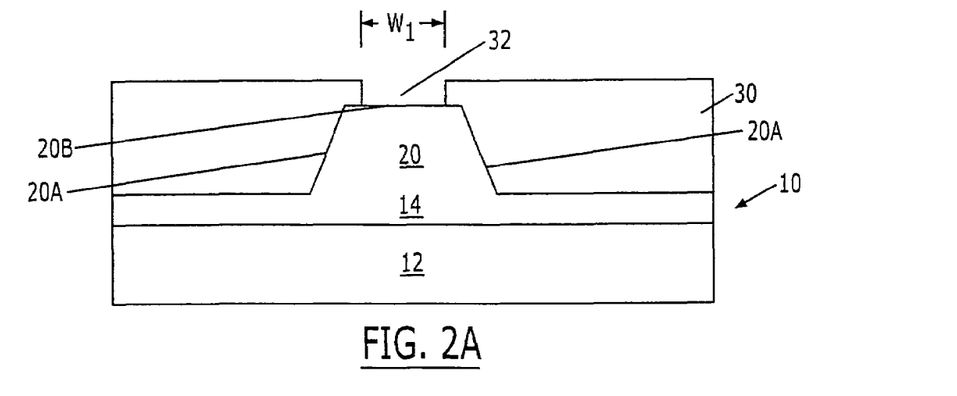
FIGS. 2A-2D are cross-sectional views illustrating steps of forming semiconductor devices according to embodiments of the present invention.

As shown, only a portion of the epitaxial semiconductor structure 14 may be included in the mesa 20. In an alternative, all of the epitaxial semiconductor structure 14 may be included in the mesa 20 so that mesa sidewalls 20A may extend to the substrate 12. The epitaxial semiconductor structure 14 may include an N-type layer on the substrate and a P-type layer on the N-type layer opposite the substrate. The mesa 20 may include portions of the N-type layer and none of the P-type layer; all of the N-type layer and portions (but not all) of the P-type layer; or all of the N-type and P-type layers (such that sidewalls of the mesa 20 extend to the substrate 12).

The epitaxial semiconductor structure 14 may also include an active layer between N-type and P-type layers. An active layer may include a number of different structures and/or layers and/or combinations thereof. The active layer, for example, may include single or multiple quantum wells, double heterostructures, and/or superlattices. An active layer may also include light and/or current confinement layers that may encourage laser action in the device.

A first passivation layer 30 may be formed on sidewalls 20A of the mesa 20 and on portions of the substrate 12 adjacent the mesa sidewalls 20A. As shown, if the mesa sidewalls 20A do not extend to the substrate 12, portions of the semiconductor structure 14 may remain between the first passivation layer 30 and the substrate adjacent the mesa sidewalls 20A. The first passivation layer 30 may be a layer or multiple sublayers of an insulating material such as silicon nitride, silicon dioxide, aluminum oxide, and/or combinations thereof. Moreover, the first passivation layer 30 may be formed using a deposition technique such as plasma enhanced chemical vapor deposition, low pressure chemical vapor deposition, chemical vapor deposition, sputtering, e-beam evaporation, and/or combinations thereof. According to particular embodiments, the first passivation layer 30 may be a layer of aluminum oxide, and the first passivation layer 30 may have a thickness in the range of approximately 0.1 to 2 microns.

The first passivation layer 30 may include a via 32 therein to provide electrical contact to the mesa surface 20B. The via 32, for example, may be formed according to steps discussed in U.S. patent application Ser. No. 10/741,334 filed Dec. 19, 2003, and in U.S. patent application Ser. No. 10/741,705 filed Dec. 19, 2003. For example, the passivation layer 30 may be formed on the mesa surface 20B and then patterned using photolithography to form the via 32 exposing portions of the mesa surface, and after forming the via 32, an ohmic contact layer can be formed on the exposed portion of the mesa surface (either before or after forming a second passivation layer). In an alternative, an ohmic contact layer may be formed on the mesa surface prior to forming the passivation layer, the passivation layer can be formed over the ohmic contact layer, and portions of the passivation layer on the ohmic contact layer can be removed. In another alternative, an ohmic contact layer can be formed on the mesa surface, and a mask used to pattern the ohmic contact layer can be maintained while forming the first passivation layer. The mask and portions of the passivation layer on the mask can be removed thereby exposing portions of the ohmic contact layer without requiring a separate mask.

Figure 2B:
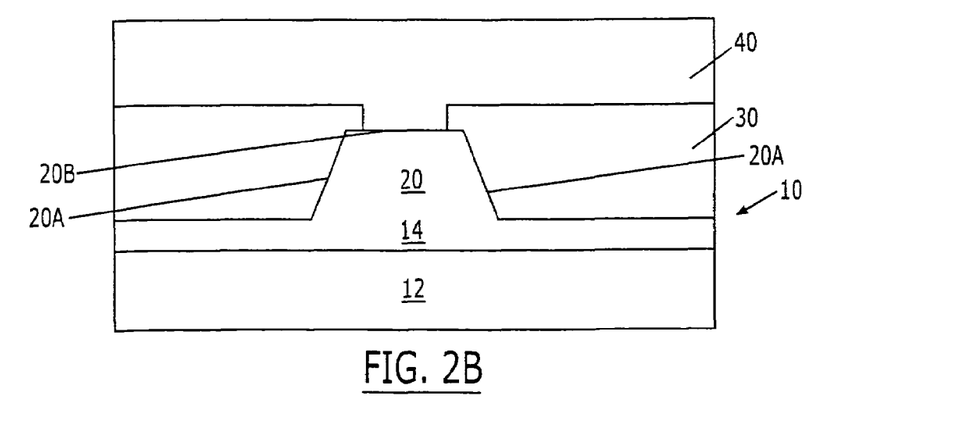

As shown in FIG. 2B, a second passivation layer 40 can be formed on the first passivation layer 30. The second passivation layer 40 may include a layer or multiple sublayers of an insulating material such as silicon nitride, silicon dioxide, and/or aluminum oxide, and the second passivation layer may be formed using a deposition technique such as plasma enhanced chemical vapor deposition, low pressure chemical vapor deposition, chemical vapor deposition, sputtering, e-beam evaporation, and/or combinations thereof.

The first passivation layer 30 may comprise a first material, and the second passivation layer 40 may comprises a second material different than the first material. Accordingly, an etchant may be selected so that the second passivation layer 40 can be etched without significantly etching the first passivation layer 30 when forming a via through the second passivation layer 40. According to particular embodiments, the first passivation layer 30 may comprise a layer of aluminum oxide, and the second passivation layer 40 may comprise a layer of silicon nitride. Accordingly, the a via hole can be etched through the second passivation layer 40 to expose portions of the first passivation layer without significantly etching the second passivation layer.

Figure 2C:
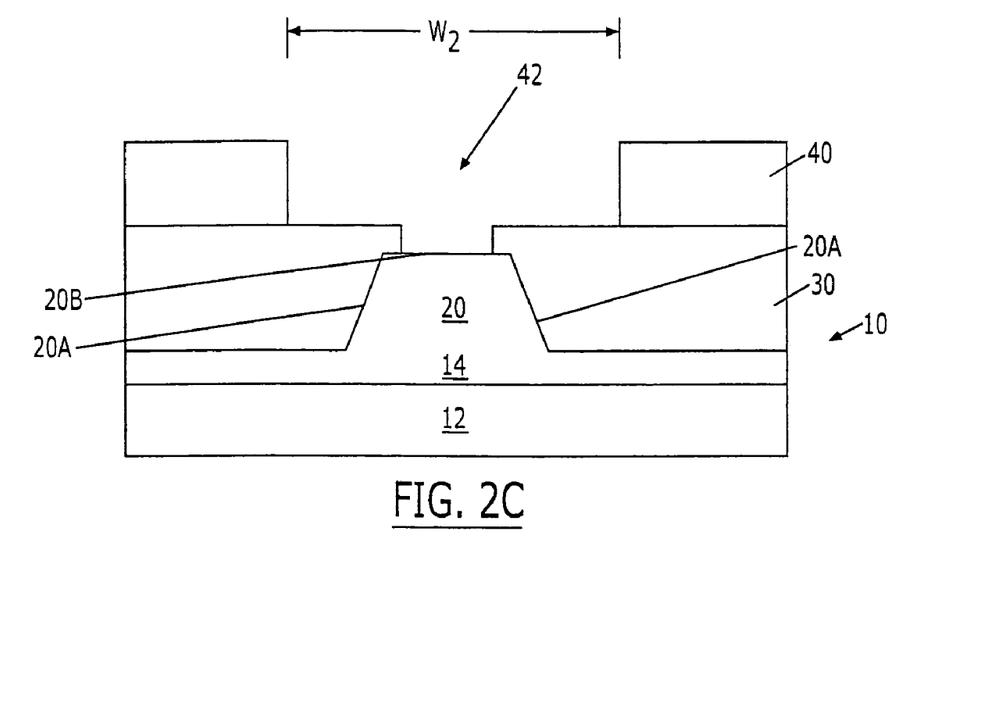

As shown in FIG. 2C, a via 42 can be opened in the second passivation layer 40 by masking portions of the second passivation layer to be maintained (by means such as photolithography) and etching exposed portions of the second passivation layer. If the via through the first passivation layer 20 has been previously formed, the via 42 may expose portions of the mesa surface 20B without further processing. In an alternative, a via through the first passivation layer 30 may be formed after forming the via 42 through the second passivation layer 40.

According to particular embodiments, the via 42 may be formed in the second passivation layer by masking portions of the second passivation layer and etching the exposed portions of the second passivation layer using a reactive ion etch (RIE). More particularly, the RIE etch can be performed using a fluorine-based etch chemistry such as $NF_2$ and/or $CHF_3$, which may be used to etch silicon nitride selectively with respect to aluminum oxide. Other etch chemistries may be used provided that the etch chemistry exhibits selectivity in etching the material of the second passivation layer with respect to the material of the first passivation layer. Etch chemistries based on $NF_2$ and/or $CHF_3$, for example, may selectively etch silicon nitride at a much higher rate that aluminum oxide. Accordingly, an aluminum oxide first passivation layer 30 may effectively act as an etch stop when etching the via 42 through a silicon nitride second passivation layer 40.

Figure 2D:
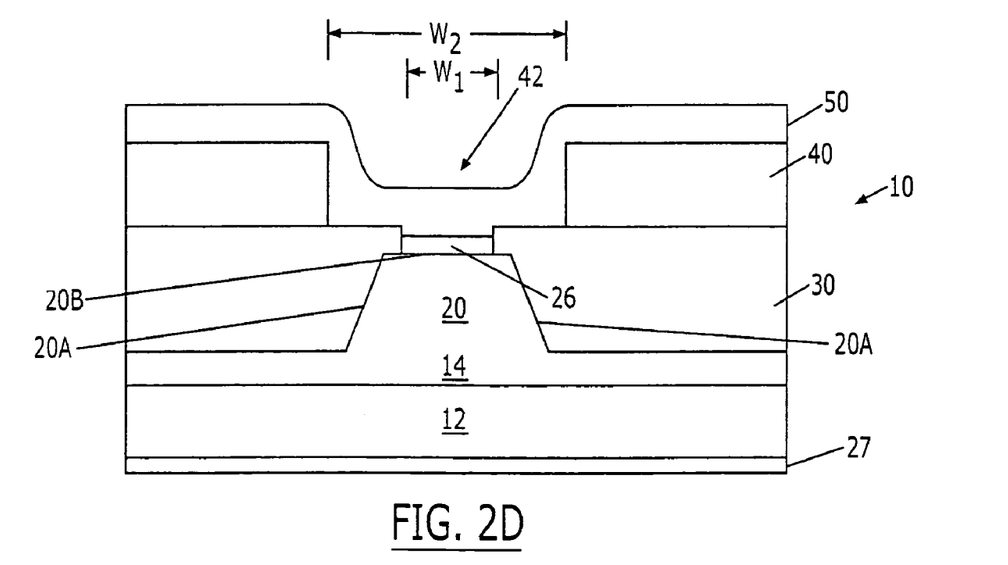

Once portions of the mesa surface 20B and the first passivation layer 30 have been exposed by the via 42, an ohmic contact 26 may be formed on the exposed portion of the mesa surface 20B as shown in FIG. 2D. In alternatives, the ohmic contact layer may be formed before forming the first passivation layer 20B, or between forming the first and second passivation layers 30 and 40. A metal overlayer 50 can then be formed on the on the second passivation layer 40, on exposed portions of the first passivation layer 30 in the via, and on the ohmic contact layer 26 in the via. According to some embodiments, the ohmic contact layer and the metal overlayer may comprise respective layers of the same or different metals. In an alternative, a separate ohmic contact layer may not be required so that the metal overlayer is formed directly on exposed portions of the mesa surface 20B.

A second ohmic contact layer 27 may also be formed on the substrate 12 opposite the semiconductor structure 14 to provide a "vertical" current path between the ohmic contact layers 26 and 27. While the ohmic contact layer 27 is shown as being formed after patterning the first and second passivation layers 30 and 40, the ohmic contact layer 27 may be formed at an earlier stage of fabrication. Moreover, a second ohmic contact layer may instead be formed on a same side of the substrate 12 as the first ohmic contact layer 26 to thereby provide a "horizontal" current flow.

According to embodiments of the present invention, a first passivation layer 30 may provide protection and/or insulation for sidewalls 20A of a semiconductor mesa 20, and a surface 20B of the semiconductor mesa may be exposed through the first passivation layer 30 to provide a relatively precise pattern. Stated in other words, a pattern having a width less than a width of the mesa surface 20B may be formed in the first passivation layer 30 to expose portions of the mesa surface 20B and/or an ohmic contact layer 26 thereon. A second passivation layer 40 can be formed on the first passivation layer 30, and the second passivation layer 40 can be patterned with a relatively imprecise pattern to expose the mesa surface 20B and/or an ohmic contact layer 26 thereon, and to expose portions of the first passivation layer 30 adjacent the mesa surface 20B. Stated in other words, a pattern of the second passivation layer 40 may have a width that is significantly greater than a width of the mesa surface 20B. Accordingly, the second passivation layer 40 may provide protection for the mesa 20 without requiring precise alignment of patterning for the second passivation layer 40.

Figure 3:
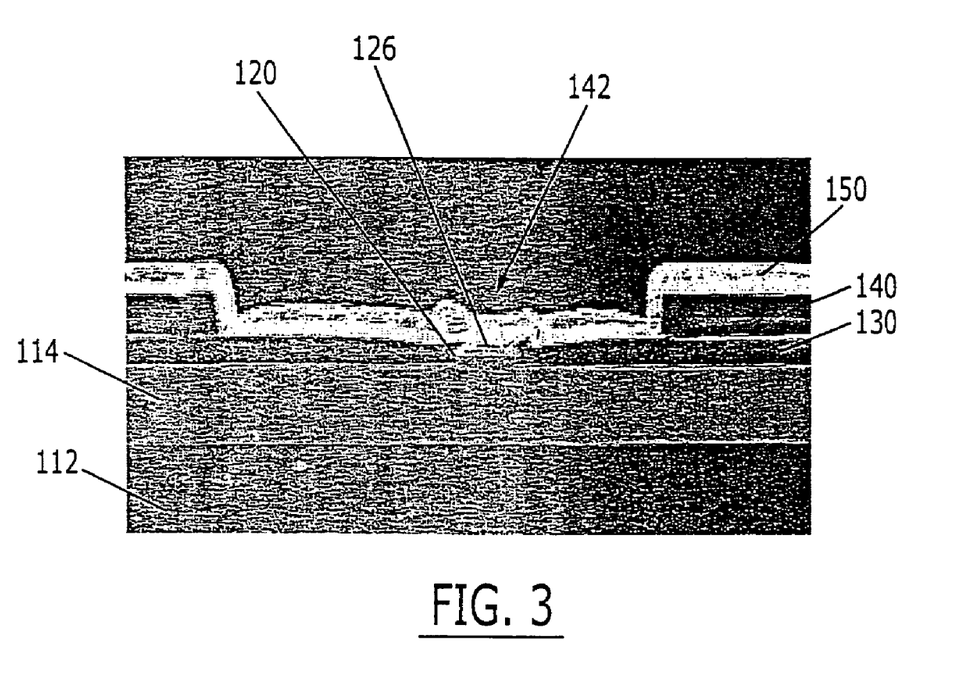
FIG. 3 is a scanning electron microscope (SEM) photomicrograph of a semiconductor device according to embodiments of the present invention.

FIG. 3 is a scanning electron microscope (SEM) photomicrograph of a structure according to embodiments of the present invention. More particularly, FIG. 3 is a photomicrograph of a laser diode structure according to embodiments of the present invention including a silicon carbide substrate 112 and an epitaxial semiconductor structure 114 comprising Group III-nitride compound semiconductor materials. Portions of the semiconductor structure 114 have been patterned into a mesa 120 and may provide optical and/or current confinement. An ohmic contact layer 126 is provided on a surface of the mesa 120 opposite the substrate 112. A first passivation layer 130 of aluminum oxide may protect and/or insulate surfaces of the epitaxial semiconductor structure 114, and a second passivation layer 140 of silicon nitride is provided on the first passivation layer 130. A via 142 through the second passivation layer 140 exposes a portion of ohmic contact 126, and metal overlayer 150 provides electrical contact with ohmic contact layer 126 through the via 142.

Figure 4:
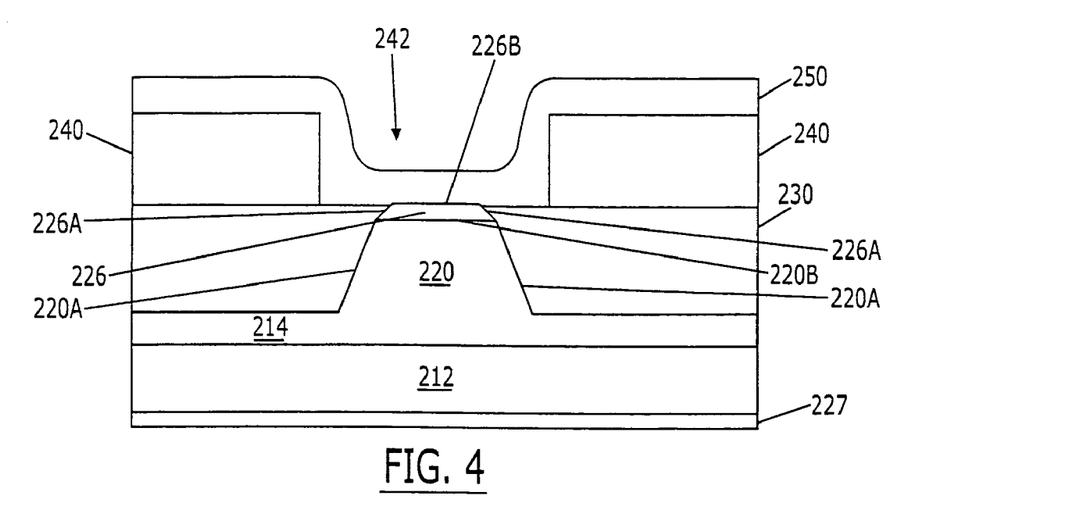
FIG. 4 is a cross-sectional view illustrating semiconductor devices according to additional embodiments of the present invention.

FIG. 4 is a cross sectional view illustrating structures according to additional embodiments of the present invention. As shown, the structure may include a substrate 212, a semiconductor structure 214, an ohmic contact layer 226, and a first passivation layer 230 on the semiconductor structure and on portions of the ohmic contact layer 226. More particularly, the semiconductor structure 214 may include a mesa 220 having mesa sidewalls 220A and a mesa surface 220B, and the ohmic contact layer 226 may include sidewalls 226A and a contact surface 226B. In embodiments illustrated in FIG. 4, the ohmic contact layer 226 can be formed before forming the passivation layer 230 so that portions of the first passivation layer 230 extend on portions of the ohmic contact layer 226.

A second passivation layer 240 is provided on the first passivation layer, and a via 242 in the second passivation layer 240 may expose the contact surface of the ohmic contact layer 226 and portions of the first passivation layer 230 adjacent the ohmic contact layer 226. A width of the via 242 in the second passivation layer 240 may be significantly greater than a width of the mesa surface 220B. In addition, a metal overlayer 250 may be provided on the second passivation layer 240, on exposed portions of the first passivation layer 230, and on the contact surface 226B of the ohmic contact layer 226. In addition, an ohmic contact layer 227 may be provided on the substrate 212 opposite the mesa 220.

The semiconductor structure 214 may include a Group III-V compound semiconductor material such as a Group III-nitride compound semiconductor material. Moreover, the semiconductor structure 214 may include an N-type layer on the substrate and a P-type layer on the N-type layer opposite the substrate 212. In addition, the mesa 220 may include portions of the P-type layer and none of the N-type layer; all of the P-type layer and portions (but not all) of the N-type layer; or all of the P-type and N-type layers (such that sidewalls 220A extend to the substrate 212).

In some embodiments, the substrate 212 may include substrate materials such as N-type silicon carbide having a polytype such as 2H, 4H, 6H, 8H, 15R, and/or 3C; sapphire; gallium nitride; and/or aluminum nitride. Moreover, the substrate 212 may be conductive to provide a "vertical" device having a "vertical" current flow through the epitaxial semiconductor structure 214 and the substrate 212. In an alternative, the substrate 212 may be insulating or semi-insulating where both ohmic contacts are provided on a same side of the substrate to provide a "horizontal" device. A conductive substrate could also be used in a "horizontal" device. Moreover, the term substrate may be defined to include a non-patterned portion of the semiconductor material making up the semiconductor structure 214, and/or there may not be a material transition between the substrate 212 and the semiconductor structure 214.

Figure 5A:
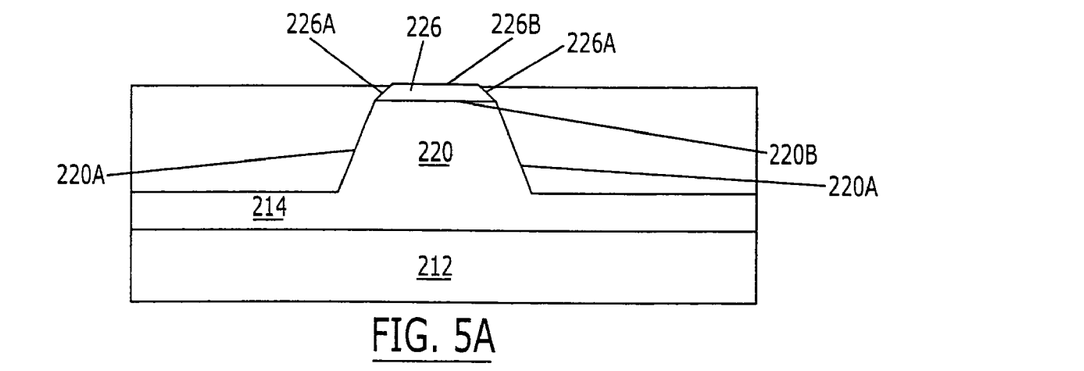
FIGS. 5A-5D are cross-sectional views illustrating steps of forming semiconductor devices according to yet additional embodiments of the present invention.

FIGS. 5A-D are cross-sectional views illustrating steps of forming structures illustrated in FIG. 4. As shown in FIG. 5A, a semiconductor structure 214 including a mesa 220 may be formed on a substrate 212, and an ohmic contact layer 226 may be formed on a surface 220B of the mesa. A passivation layer 230 can then be formed on sidewalls 220A of the mesa 220, on portions of the substrate adjacent the mesa sidewalls 220A and on portions of the ohmic contact layer 226. As shown in FIG. 5A, the passivation layer 230 may extend onto portions of beveled sidewalls 226A adjacent to the mesa sidewalls 220A while the contact surface 226B and portions of the beveled sidewalls 226A adjacent to the contact surface 226B are maintained free of the passivation layer 230. In an alternative, portions of the passivation layer 230 may extend onto surface portions of the ohmic contact layer parallel with the substrate.

The mesa 220 and the ohmic contact layer 226, for example, may be formed using a single patterning step as discussed, for example, in U.S. application Ser. No. 10/741,705. More particularly, a semiconductor layer of uniform thickness may be formed, a contact metal layer may be formed on the semiconductor layer of uniform thickness, and a mask may be formed on the contact metal layer. The contact metal layer and the semiconductor layer can then be etched using the single mask to form the ohmic contact layer 226 and the mesa 220. Moreover, the mask may be maintained while forming the first passivation layer 230, and the mask and portions of the first passivation layer on the mask can be removed to expose the contact surface 226B of the ohmic contact layer. Accordingly, a single mask may provide alignment of the ohmic contact layer with the mesa surface, and the single mask may provide alignment of a "via" through the passivation layer exposing the contact surface 226A of the ohmic contact layer 226.

In an alternative, the ohmic contact layer 226 and/or the passivation layer 230 may be patterned using a separate masking operation(s). For example, the mesa 220 and the ohmic contact layer 226 may be patterned using a first mask, and a via may be patterned in the passivation layer 230 using a second mask. In another alternative, the mesa 220 may be patterned using a first mask, the ohmic contact layer 226 may be patterned using a second mask, and a via may be patterned in the passivation layer 230 using a third mask.

Figure 5B:
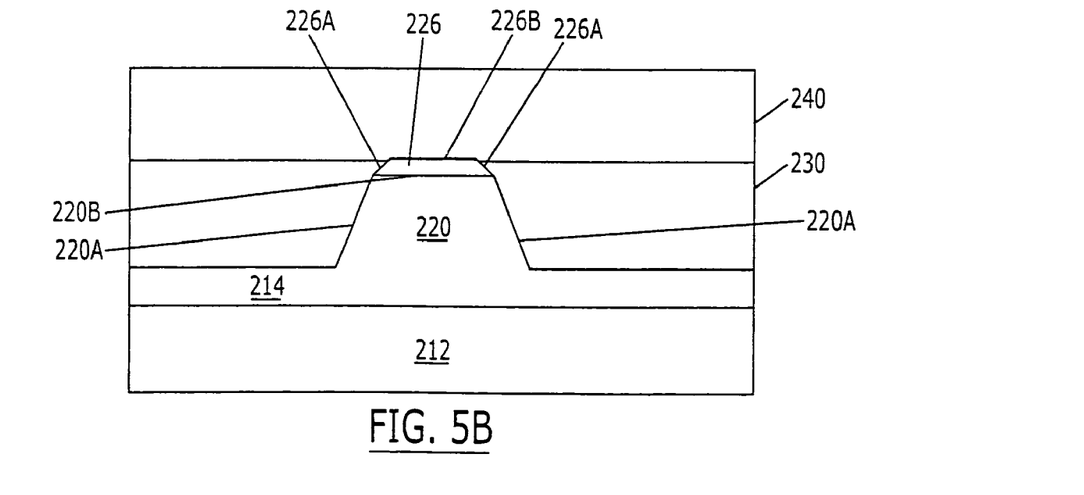

As shown in FIG. 5B, a second passivation layer 240 can be formed on the first passivation layer 230 and on exposed portions of the ohmic contact layer 226. Each of the first a second passivation layers 230 and 240 may comprise a layer of an insulting material such as silicon nitride, silicon dioxide, and/or aluminum oxide. Moreover, each of the first and second passivation layers 230 and 240 may comprise a different material such that the second passivation layer 230 can be etched using an etch chemistry that is selective with respect to the first passivation layer 240. For example, the first passivation layer 230 may comprises a layer of aluminum oxide, the second passivation layer 240 may comprise a layer of silicon nitride, and a fluorine based etch chemistry may be used to etch the second passivation layer 240 without etching the first passivation layer 230.

Figure 5C:
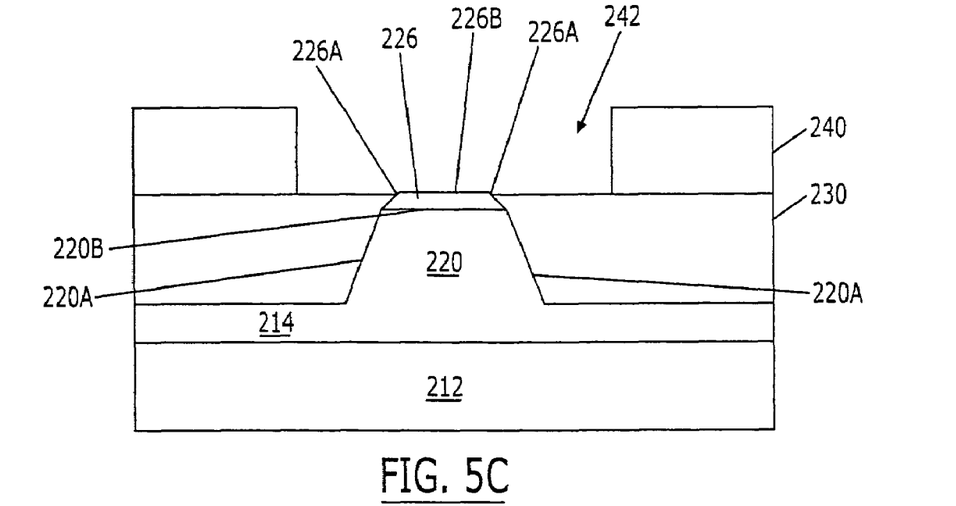
Figure 5D:
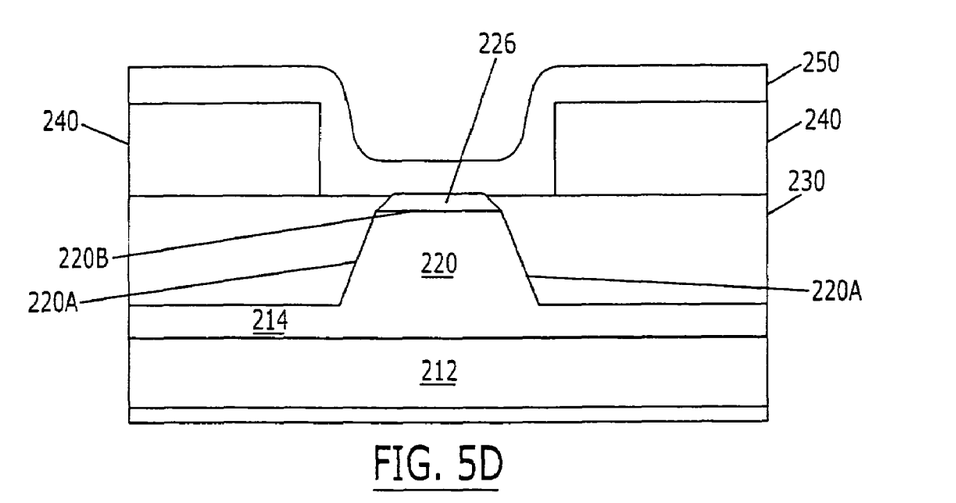

As shown in FIG. 5C, the second passivation layer 240 may be patterned to expose the contact surface 226B of the ohmic contact layer 226, and to expose portions of the first passivation layer 230 adjacent the ohmic contact layer 226. A width of the via 242 in the passivation layer 240 may be significantly greater than a width of the mesa surface 220B. More particularly, the mesa surface 220A may have a width in the range of approximately 1 to 3 microns, and the via 242 through passivation layer 240 may have a width in the range of approximately 5 to 15 microns. Accordingly, a high degree of precision may not be required when patterning the via 242 in the passivation layer 240. As shown in FIG. 5D, a metal overlayer 250 can be formed on the passivation layer 240, on exposed portions of the first passivation layer 230, and on exposed portions of the ohmic contact layer 226.

According to embodiments of the present invention, a first passivation layer may provide relatively precise exposure of an ohmic contact layer on a semiconductor mesa (or exposure of a surface of the semiconductor mesa) and protection of sidewalls of the mesa. A second passivation layer of a different material may provide structural protection for the mesa without requiring a high degree of precision in the patterning thereof.

Semiconductor devices discussed above may provide edge emitting semiconductor lasers with light being emitted parallel to the substrate along a lengthwise direction of a semiconductor mesa stripe. Stated in other words, the light may be emitted along a direction perpendicular to the cross sections of figures discussed above. While methods and devices have been discussed with reference to methods of forming light emitting devices such as laser diodes, methods according to embodiments of the present invention may be used to form other semiconductor devices such as conventional diodes, conventional light emitting diodes, or any other semiconductor device including a semiconductor mesa.

While this invention has been particularly shown and described with reference to preferred embodiments thereof, it will be understood by those skilled in the art that various changes in form and details may be made therein without departing from the spirit and scope of the invention as defined by the appended claims and their equivalents.

That which is claimed is:

1. A semiconductor device comprising:
   a semiconductor structure defining a semiconductor mesa having a mesa surface and mesa sidewalls;
   a first passivation layer on at least portions of the mesa sidewalls wherein at least a portion of the mesa surface is free of the first passivation layer and wherein the first passivation layer comprises a first material; and
   a second passivation layer on the first passivation layer wherein at least a portion of the mesa surface is free of the second passivation layer, and wherein the second passivation layer comprises a second material different than the first material wherein a combined thickness of the first and second passivation layers is greater than a thickness of the semiconductor mesa, and
   wherein the semiconductor mesa is on a semiconductor base layer, wherein the mesa sidewalls are between the mesa surface and the semiconductor base layer, wherein the semiconductor base layer extends beyond the mesa sidewalls in a direction parallel with respect to the mesa surface, and wherein the semiconductor structure defines a current path through the semiconductor mesa and portions of the semiconductor base layer outside the semiconductor mesa.

2. A semiconductor device according to claim 1 wherein at least a portion of the first passivation layer adjacent the mesa surface is free of the second passivation layer.

3. A semiconductor device comprising:
   a semiconductor structure defining a semiconductor mesa having a mesa surface and mesa sidewalls;
   a first passivation layer on at least portions of the mesa sidewalls wherein at least a portion of the mesa surface is free of the first passivation layer and wherein the first passivation layer comprises a first material;
   a second passivation layer on the first passivation layer wherein at least a portion of the mesa surface is free of the second passivation layer, and wherein the second passivation layer comprises a second material different than the first material;
   a metal contact layer on a portion of the mesa surface free of the first and second passivation layers wherein the metal contact layer is confined on the mesa surface; and
   a metal overlayer on the metal contact layer wherein the metal overlayer extends on at least a portion of the second passivation layer opposite the first passivation layer wherein the metal overlayer and the metal contact layer comprise different materials, and wherein a current path is defined through the semiconductor mesa, the metal contact layer, and the metal overlayer.

4. A semiconductor device according to claim 1 wherein a thickness of the first passivation layer is greater than a thickness of the semiconductor mesa.

5. A semiconductor device comprising:
   a semiconductor structure defining a semiconductor mesa having a mesa surface and mesa sidewalls;
   a first passivation layer on at least portions of the mesa sidewalls wherein at least a portion of the mesa surface is free of the first passivation layer and wherein the first passivation layer comprises a first material;
   a second passivation layer on the first passivation layer wherein at least a portion of the mesa surface is free of the second passivation layer, and wherein the second passivation layer comprises a second material different than the first material wherein a combined thickness of the first and second passivation layers is greater than a thickness of the semiconductor mesa; and
   a metal contact layer on a portion of the mesa surface free of the first and second passivation layers.

6. A semiconductor device according to claim 5 further comprising:
   a metal overlayer on the metal contact layer wherein the metal overlayer extends on at least a portion of the second passivation layer opposite the first passivation layer.

7. A semiconductor device according to claim 3 wherein a combined thickness of the first and second passivation layers is greater than a thickness of the mesa.

8. A semiconductor device comprising:
   a semiconductor structure defining a semiconductor mesa having a mesa surface and mesa sidewalls;
   a first passivation layer on at least portions of the mesa sidewalls wherein at least a portion of the mesa surface is free of the first passivation layer and wherein the first passivation layer comprises a first material;
   a second passivation layer on the first passivation layer wherein at least a portion of the mesa surface is free of the second passivation layer, and wherein the second passivation layer comprises a second material different than the first material; and
   a metal contact layer on a portion of the mesa surface free of the first and second passivation layers;
   wherein a portion of the first passivation layer extends on a portion of a surface of the metal contact layer opposite the mesa surface.

9. A semiconductor device according to claim 5 wherein a portion of the metal contact layer extends on a portion of at least one of the first and/or second passivation layers.

10. A semiconductor device according to claim 1 wherein the first material comprises aluminum oxide.

11. A semiconductor device according to claim 1 wherein the second material comprises silicon nitride.

12. A semiconductor device according to claim 1 wherein the semiconductor structure includes a P-type layer and an N-type layer wherein at least a portion of the P-type layer and/or N-type layer is included the semiconductor mesa.

13. A semiconductor device according to claim 1 wherein the first and second passivation layers define a stair-step profile adjacent the at least a portion of the mesa surface free of the first and second passivation layers.

14. A semiconductor device according to claim 1 wherein the second material comprises a material that can be etched preferentially with respect to the first material using a predetermined etch chemistry.

15. A semiconductor device according to claim 1 further comprising:
   a substrate wherein the semiconductor structure is on the substrate and wherein the mesa sidewalls are between the mesa surface and the substrate.

16. A semiconductor device comprising:
a semiconductor structure defining a semiconductor mesa having a mesa surface and mesa sidewalls wherein the semiconductor mesa is on a semiconductor base layer, wherein the mesa sidewalls are between the mesa surface and the semiconductor base layer, and wherein the semiconductor base layer extends beyond the mesa sidewalls in a direction parallel with respect to the mesa surface; and
a passivation layer on the semiconductor base layer and on the mesa sidewalls, the passivation layer having a via hole therein so that at least a portion of the mesa surface is free of the passivation layer, the via hole defining a stair-step profile such that a first portion of the via hole has a first width and a second portion of the via hole has a second width different than the first width;
wherein the semiconductor structure defines a current path through the semiconductor mesa and portions of the semiconductor base layer outside the semiconductor mesa.

17. A semiconductor device according to claim 16 wherein the stair-step profile includes a plateau region between the first and second portions of the via hole having the first and second widths.

18. A semiconductor device according to claim 17 wherein the plateau region is substantially parallel with respect to the mesa surface.

19. A semiconductor device according to claim 16 wherein the first portion of the via hole having the first width is between the second portion of the via hole having the second width and the mesa surface and wherein the second width is greater than the first width.

20. A semiconductor device according to claim 16 wherein the passivation layer comprises a first layer of a first material and second layer of a second material different than the first material and wherein the first portion of the via hole is through at least a portion of the first layer and wherein the second portion of the via hole is through at least a portion of the second layer.

21. A semiconductor device according to claim 20 wherein a thickness of the first passivation layer is greater than a thickness of the semiconductor mesa.

22. A semiconductor device according to claim 20 wherein the first material comprises aluminum oxide.

23. A semiconductor device according to claim 20 wherein the second material comprises silicon nitride.

24. A semiconductor device according to claim 20 wherein the second material comprises a material that can be etched preferentially with respect to the first material using a predetermined etch chemistry.

25. A semiconductor device according to claim 16 further comprising:
a metal contact layer on the at least a portion of the mesa surface free of the passivation layer.

26. A semiconductor device according to claim 25 further comprising a metal overlayer on the metal contact layer and on at least portions of the passivation layer.

27. A semiconductor device according to claim 26 wherein the metal contact layer and the metal overlayer comprise different materials wherein the metal contact layer is confined on the mesa surface, and wherein the current path is further defined through the semiconductor mesa, the metal contact layer, and the metal overlayer.

28. A semiconductor device according to claim 25 wherein a portion of the passivation layer extends on a portion of the metal contact layer opposite the mesa surface.

29. A semiconductor device according to claim 25 wherein the metal contact layer extends onto at least a portion of the passivation layer.

30. A semiconductor device according to claim 16 wherein the semiconductor structure includes a P-type layer and an N-type layer wherein at least a portion of the P-type layer and/or the N-type layer is included in the semiconductor mesa.

31. A semiconductor device according to claim 16 wherein the semiconductor base layer comprises a semiconductor substrate.

32. A semiconductor device according to claim 16 wherein the semiconductor structure defines a current path through the semiconductor mesa and the semiconductor base layer between the mesa surface and a surface of the semiconductor base layer opposite the semiconductor mesa.

33. A semiconductor device according to claim 16 wherein the current path extends into the semiconductor base layer beyond at least one of the mesa sidewalls in a direction parallel with respect to a surface of the semiconductor base layer.

34. A semiconductor device according to claim 1 wherein the semiconductor structure defines a current path through the semiconductor mesa and the semiconductor base layer between the mesa surface and a surface of the semiconductor base layer opposite the semiconductor mesa.

35. A semiconductor device according to claim 1 wherein the current path extends into the semiconductor base layer beyond at least one of the mesa sidewalls in a direction parallel with respect to a surface of the semiconductor base layer.

36. A semiconductor device according to claim 6 wherein the metal contact layer is confined on the mesa surface, and wherein the metal overlayer and the metal contact layer comprise different materials, and wherein a current path is defined through the semiconductor mesa, the metal contact layer, and the metal overlayer.

37. A semiconductor device according to claim 5 wherein a portion of the first passivation layer extends on a portion of a surface of the metal contact layer opposite the mesa surface.

38. A semiconductor device comprising:
a semiconductor structure defining a semiconductor mesa having a mesa surface and mesa sidewalls;
a first passivation layer on at least portions of the mesa sidewalls wherein at least a portion of the mesa surface is free of the first passivation layer and wherein the first passivation layer comprises a first material; and
a second passivation layer on the first passivation layer wherein at least a portion of the mesa surface is free of the second passivation layer, and wherein the second passivation layer comprises a second material different than the first material wherein a combined thickness of the first and second passivation layers is greater than a thickness of the semiconductor mesa,
wherein the semiconductor mesa is on a semiconductor base layer, wherein the mesa sidewalls are between the mesa surface and the semiconductor base layer, wherein the semiconductor base layer extends beyond the mesa sidewalls in a direction parallel with respect to the mesa surface, wherein the semiconductor structure defines a current path through the semiconductor mesa and portions of the semiconductor base layer outside the semiconductor mesa, wherein the first and second passivation layers define a via hole having a stair-step profile adjacent the at least a portion of the mesa surface free of the first and second passivation layers, wherein a first portion of the via hole through the first passivation layer has a first width, wherein a second portion of the via hole through the second passivation layer has a second width greater than the first width, and wherein the stair-step profile includes a plateau region between the first and second portions of the via hole having the first and second widths.

39. A semiconductor device according to claim 1 wherein the first passivation layer comprises a first insulating passivation layer and wherein the second passivation layer comprises a second insulating passivation layer.

* * * * *